United States Patent
Itoh et al.

(10) Patent No.: US 8,774,242 B2
(45) Date of Patent: Jul. 8, 2014

(54) SURFACE EMITTING LASER DIODE, OPTICAL SCANNING APPARATUS AND IMAGE FORMING APPARATUS

(75) Inventors: Akihiro Itoh, Miyagi (JP); Kazuhiro Harasaka, Miyagi (JP); Shunichi Sato, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 91 days.

(21) Appl. No.: 13/466,217

(22) Filed: May 8, 2012

(65) Prior Publication Data
US 2012/0294652 A1    Nov. 22, 2012

(30) Foreign Application Priority Data

May 17, 2011   (JP) .................. 2011-110127
Feb. 2, 2012   (JP) .................. 2012-020444

(51) Int. Cl.
*H01S 5/00*    (2006.01)

(52) U.S. Cl.
USPC ............. 372/45.01; 372/19; 372/46.013; 372/49.01

(58) Field of Classification Search
CPC ..... H01S 5/028; H01S 5/0281; H01S 5/0286; H01S 5/0287; H01S 5/0653–5/0655; H01S 5/18308–5/18313; H01S 5/18338
See application file for complete search history.

(56) References Cited

U.S. PATENT DOCUMENTS

| | | | |
|---|---|---|---|
| 6,590,917 B2 | 7/2003 | Nakayama et al. | |
| 7,684,458 B2 | 3/2010 | Sato et al. | |
| 7,693,204 B2 | 4/2010 | Sato et al. | |
| 7,720,125 B2 | 5/2010 | Jikutani et al. | |
| 7,746,912 B2 | 6/2010 | Motomura et al. | |
| 7,800,805 B2 | 9/2010 | Hayashi et al. | |
| 7,957,444 B2 | 6/2011 | Itoh et al. | |

(Continued)

FOREIGN PATENT DOCUMENTS

| | | |
|---|---|---|
| JP | 2001-284722 | 10/2001 |
| WO | WO2010/140600 A1 | 12/2010 |
| WO | WO2011/034194 A1 | 3/2011 |
| WO | WO2011/148957 A1 | 12/2011 |

OTHER PUBLICATIONS

Martinsson, H., et al. (1999), "Transverse Mode Selection in Large-Area Oxide-Confined Vertical-Cavity Surface-Emitting Lasers Using a Shallow Surface Relief," IEEE Phototonics Technology Letters, vol. 11, No. 12, pp. 1536-1538.

(Continued)

*Primary Examiner* — Armando Rodriguez
*Assistant Examiner* — Sean Hagan
(74) *Attorney, Agent, or Firm* — Cooper & Dunham LLP

(57) ABSTRACT

A surface emitting laser diode comprises a substrate, a lower reflector formed over the substrate, an active layer formed over the lower reflector, an upper reflector formed over the active layer, a current restrict structure including a current confinement region surrounded by insulation region. The current restrict structure is disposed in an upper reflector or between an active layer and the upper reflector, and an upper electrode formed over the upper reflector includes an aperture which corresponds to an emission region from which light is emitted in a first direction perpendicular to a surface of a substrate. The emission region and the current restrict structure including the current confinement region are selectively configured to obtain high single transverse mode, stabilized polarization direction, isotropic beam cross section and small divergence angle, while allowing the device to be manufactured with high yield rate.

12 Claims, 20 Drawing Sheets

(56) References Cited

U.S. PATENT DOCUMENTS

| | | |
|---|---|---|
| 7,978,739 B2 | 7/2011 | Sugawara et al. |
| 7,981,700 B2 | 7/2011 | Sato et al. |
| 8,035,676 B2 | 10/2011 | Harasaka et al. |
| 8,089,498 B2 | 1/2012 | Sato et al. |
| 8,111,725 B2 | 2/2012 | Ishii et al. |
| 2003/0026308 A1 | 2/2003 | Iwai et al. |
| 2003/0039294 A1* | 2/2003 | Ueki et al. .................. 372/96 |
| 2007/0014324 A1* | 1/2007 | Maeda et al. ............. 372/46.01 |
| 2008/0055672 A1 | 3/2008 | Watanabe et al. |
| 2009/0295902 A1 | 12/2009 | Sato et al. |
| 2009/0303308 A1 | 12/2009 | Itoh et al. |
| 2010/0189467 A1 | 7/2010 | Sato et al. |
| 2010/0214633 A1 | 8/2010 | Sato et al. |
| 2010/0311194 A1 | 12/2010 | Sasaki et al. |
| 2010/0328747 A1 | 12/2010 | Jikutani et al. |
| 2011/0037825 A1 | 2/2011 | Jikutani et al. |
| 2011/0115872 A1 | 5/2011 | Harasaka et al. |
| 2011/0116147 A1 | 5/2011 | Motomura et al. |
| 2011/0128343 A1 | 6/2011 | Sato et al. |
| 2011/0170155 A1 | 7/2011 | Jikutani et al. |
| 2011/0176122 A1 | 7/2011 | Kaminishi et al. |
| 2011/0211869 A1 | 9/2011 | Shouji et al. |
| 2011/0217077 A1 | 9/2011 | Harasaka et al. |
| 2011/0228035 A1 | 9/2011 | Ishii et al. |
| 2011/0261850 A1 | 10/2011 | Shouji et al. |
| 2011/0304684 A1 | 12/2011 | Numata et al. |
| 2012/0057902 A1 | 3/2012 | Shouji et al. |

OTHER PUBLICATIONS

Camarena, M., et al. (2002), "Polarization Behavior and Mode Structure of Elliptical Surface Relief VCSELs," Proceedings Symposium IEEE/LEOS Benelux Chapter, Amsterdam, pp. 103-106.

Haglund, Å., et al. (2004), "Single Fundamental-Mode Output Power Exceeding 6 mW From VCSELs With a Shallow Surface Relief," IEEE Phototonics Technology Letters, vol. 16,. No. 2, pp. 368-370.

* cited by examiner

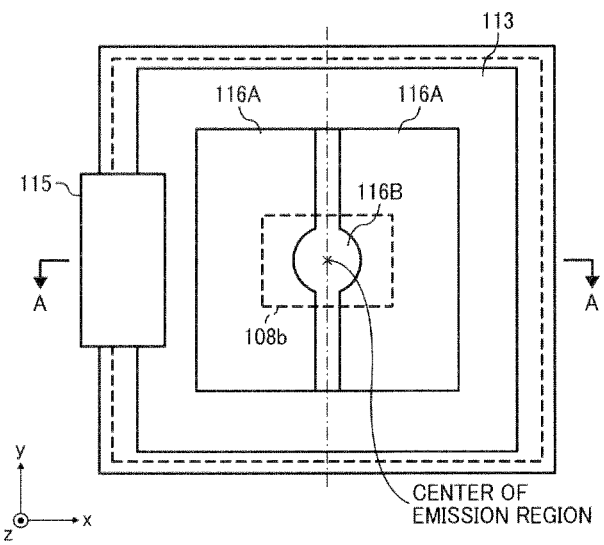
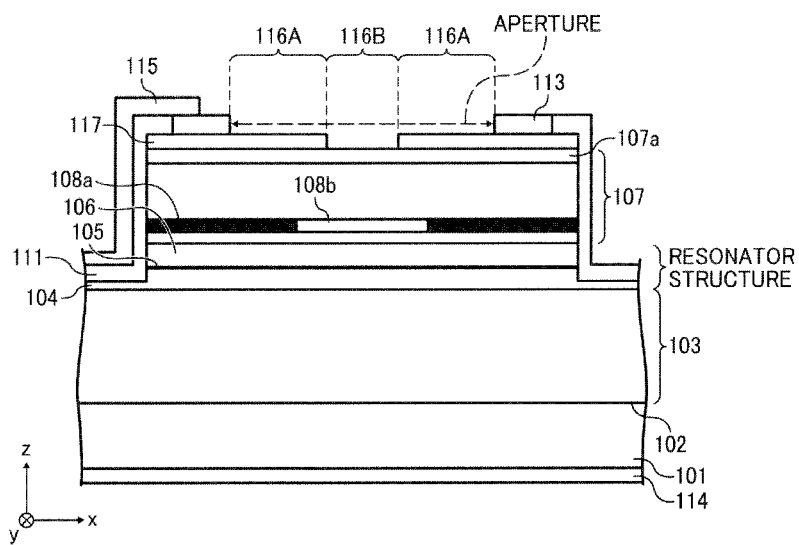

FIG. 12

| TYPE | CURRENT CONFINEMENT REGION | | UPPER ELECTRODE APERTURE | SEMICONDUCTOR SURFACE STRUCTURE (116A) |
|---|---|---|---|---|
| | SHAPE | STRAIN RATIO | | |
| TYPE A | RECTANGLE | 0.93 | SQUARE | DIVIDED TWO IN x AXIS DIRECTION |
| TYPE B | SQUARE | 1.00 | SQUARE | DIVIDED TWO IN x AXIS DIRECTION |
| TYPE C | CIRCLE | 1.00 | SQUARE | DIVIDED TWO IN x AXIS DIRECTION |
| TYPE D | RECTANGLE | 0.93 | CIRCLE | DIVIDED TWO IN x AXIS DIRECTION |
| TYPE E | RECTANGLE | 0.93 | CIRCLE | DIVIDED TWO IN y AXIS DIRECTION |
| TYPE F | RECTANGLE | 0.93 | CIRCLE | NONE |
| TYPE G | ELLIPSE A | 0.80 | SQUARE | DIVIDED TWO IN x AXIS DIRECTION |
| TYPE H | ELLIPSE B | 1.09 | SQUARE | DIVIDED TWO IN x AXIS DIRECTION |

FIG. 13

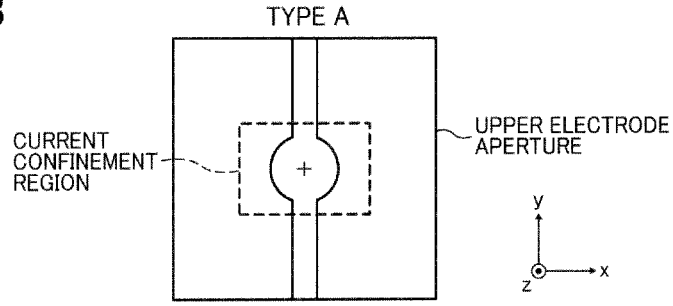

FIG. 14

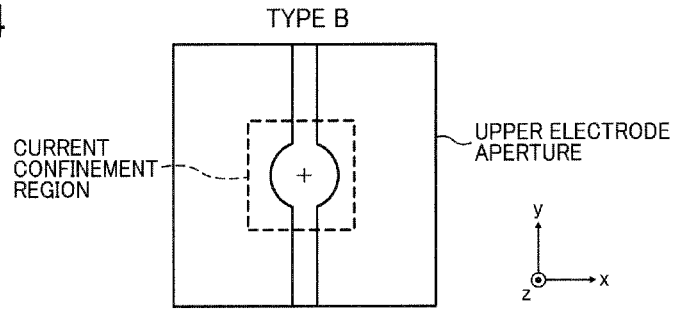

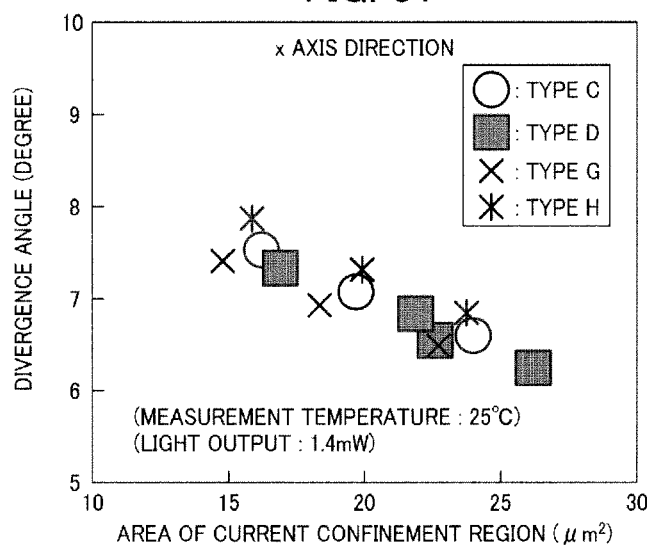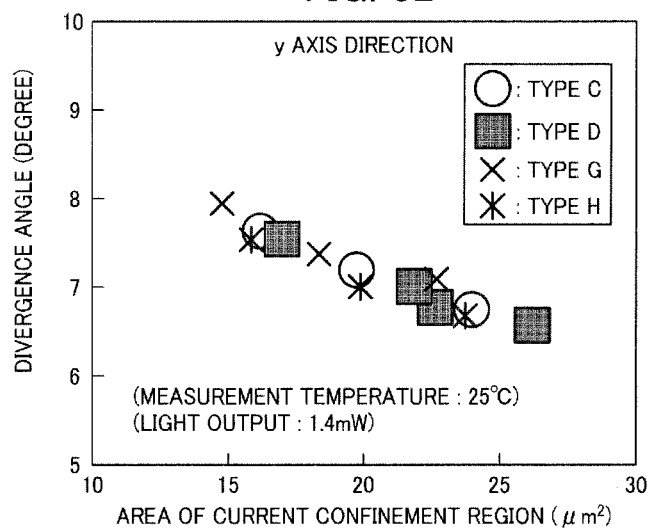

FIG. 33

| TYPE | CURRENT CONFINEMENT REGION SHAPE | CURRENT CONFINEMENT REGION STRAIN RATIO | UPPER ELECTRODE APERTURE | SEMICONDUCTOR SURFACE STRUCTURE | EVALUATION |
|---|---|---|---|---|---|
| TYPE A | RECTANGLE | 0.93 | SQUARE | DIVIDED TWO IN x AXIS DIRECTION | GOOD |
| TYPE B | SQUARE | 1.00 | SQUARE | DIVIDED TWO IN x AXIS DIRECTION | GOOD |
| TYPE C | CIRCLE | 1.00 | SQUARE | DIVIDED TWO IN x AXIS DIRECTION | NOT SATISFACTORY |
| TYPE D | RECTANGLE | 0.93 | CIRCLE | DIVIDED TWO IN x AXIS DIRECTION | GOOD |
| TYPE E | RECTANGLE | 0.93 | CIRCLE | DIVIDED TWO IN y AXIS DIRECTION | NOT SATISFACTORY |
| TYPE F | RECTANGLE | 0.93 | CIRCLE | NONE | NOT SATISFACTORY |
| TYPE G | ELLIPSE A | 0.80 | SQUARE | DIVIDED TWO IN x AXIS DIRECTION | GOOD |
| TYPE H | ELLIPSE B | 1.09 | SQUARE | DIVIDED TWO IN x AXIS DIRECTION | NOT SATISFACTORY |

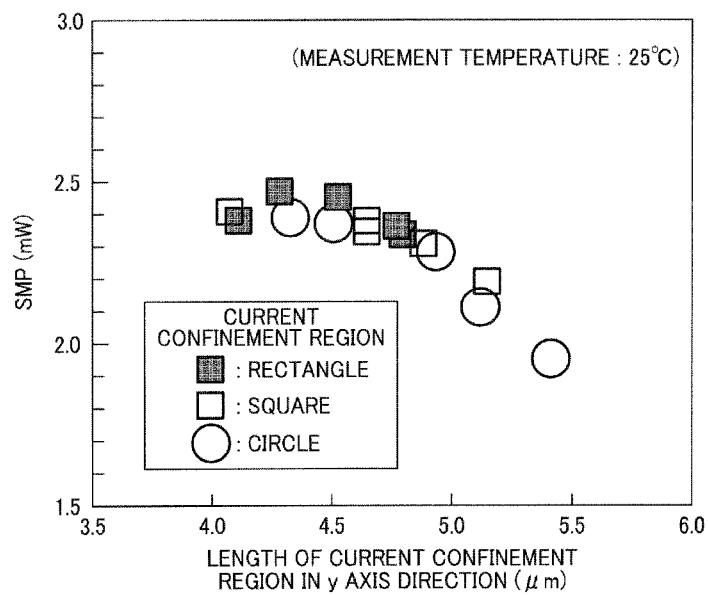

FIG. 34

SURFACE EMITTING LASER DIODE, OPTICAL SCANNING APPARATUS AND IMAGE FORMING APPARATUS

CROSS-REFERENCE TO RELATED APPLICATIONS

The present application claims priority to, and incorporates by reference the entire contents of, Japanese Patent Application No. 2011-110127 filed with the Japanese Patent Office on May 17, 2011 and Japanese Patent Application No. 2012-020444 filed with the Japanese Patent Office on Feb. 2, 2012

BACKGROUND

1. Technical Field

This disclosure generally relates to surface emitting laser diode, surface emitting laser array, optical scanning device and image forming apparatus, and more particularly to a surface emitting laser diode emitting a laser beam in a direction perpendicular to a substrate, a surface emitting laser array including a plurality of such surface emitting laser diodes, an optical scanning device having such a surface emitting laser array, and an image forming apparatus having such an optical scanning device.

2. Description of the Related Art

A surface emission laser diode of vertical cavity surface emission laser (VCSEL) structure is a laser diode that emits light in a direction perpendicular to a substrate and draws attention these days in view of its advantageous features of low cost, low power consumption and compact size as compared with the laser diode of edge emission structure that emits light in a direction parallel to the substrate. Further, such a surface emission laser diode of VCSEL structure has high performance and is suitable for constructing a two dimensional device.

The laser diode of VCSEL structure can be used for example for the optical source used for optical writing in printers, or the like, the optical source used for optical writing in optical disk apparatuses (oscillation wavelength: 780 nm; 850 nm), and the optical source for optical transmission systems such as LAN (local area network) that uses optical fibers (oscillation wavelength: 1.3 um; 1.5 um). Further, it is thought promising to use such a surface emission laser diode for the optical source of optical transmission between circuit boards, between devices inside a circuit board, between chips forming an LSI (large scale integrated circuit), and between the device elements inside an LSI.

It is desirable for the optical source for optical transmission systems to emit single wavelength and high output power.

Further, it is desirable for the optical source for optical writing in optical scanning apparatus of image forming apparatus to have stable polarization direction.

For example, each of Japanese Patent No. 3697903, Japanese Laid-Open Patent Application No. 2001-284722, IEEE Photonics Technology Letters, Vol. 11 (1999) Pp. 1536-1538 and IEEE Photonics Technology Letters, Vol. 16 (2004) Pp. 368-370 proposes a configuration of a surface emitting laser diode for performing single transverse mode emission and high power output. However, such surface emitting laser diode has a trench installed on the top surface which emits in single transverse mode.

A surface emitting laser diode was proposed in Proceedings Symposium IEEE/LEOS Benelux Chapter, 2002, Amsterdam, Pp. 103-106, having a concavo-convex shape formed on a top surface of the surface emitting laser diode and such shape has shape anisotropy in direction perpendicular to emission direction. The surface emitting laser diode has single transverse mode, high power and stabilized polarization direction.

Controlling polarization direction is known by using inclined substrate.

However, even if the conventional technologies are combined, it is difficult to manufacture surface emitting laser diode having single transverse mode, high power, stable polarization direction, isotropic cross sectional shape of output beam and small divergence angle with high productivity.

BRIEF SUMMARY

In an aspect of this disclosure, a surface emitting laser diode comprises a substrate, a lower reflector formed over the substrate, an active layer formed over the lower reflector, an upper reflector formed over the active layer, a current restrict structure including a current confinement region surrounded by insulation region. The current restrict structure is disposed in the upper reflector or between the active layer and the upper reflector, and an upper electrode formed over the upper reflector includes an aperture which corresponds to an emission region from which light is emitted in a first direction perpendicular to a surface of the substrate. The emission region includes a higher reflectance region having relatively higher reflectance and including a center of the emission region, and the emission region also 0 includes a lower reflectance region having relatively lower reflectance. A first current confinement region length of the current confinement region passing the center of the emission region and parallel to a second direction which is perpendicular to the first direction is equal to or smaller than a second current confinement region length passing the center of the emission region in any other direction. A third current confinement region length of one of the any other direction is larger than the first current confinement region length. A first higher reflectance region length of the higher reflectance region passing the center of the emission region and parallel to the second direction is larger than a second higher reflectance region length passing the center of the emission region and parallel to a third direction which is perpendicular to both the first direction and the second direction.

In another aspect of this disclosure, an optical scanning device is configured for optically scanning a scanning surface with light, and the optical scanning device comprises a light source including the surface emitting laser element described herein, a deflector configured to deflect the light emitted from the light source and a scanning optical system configured to converge the light deflected by the deflector onto the scanning surface.

In another aspect, an image forming apparatus comprises at least one image carrying member and the aforementioned optical scanning device configured to scan light modulated based on image information on the image carrying member.

According to the devices and methodologies of this disclosure, high single transverse mode, stabilized polarization direction, isotropic beam cross section and small divergence angle may be realized in high yield rate.

BRIEF DESCRIPTION OF THE DRAWINGS

FIG. 7A is a diagram illustrating an emitting part viewing from z axis direction;

FIG. 7B is a diagram illustrating a cross section view of A-A in FIG. 7A;

FIG. 12 is a table illustrating variation of surface emitting laser diodes;

FIG. 13 is a diagram illustrating type A of surface emitting laser diode;

FIG. 14 is a diagram illustrating type B of surface emitting laser diode;

FIG. 31 is a diagram illustrating relationship between divergence angle in x axis direction and area of current confinement region as for type C, type D, type G and type H of surface emitting laser diodes;

FIG. 32 is a diagram illustrating relationship between divergence angle in y axis direction and area of current confinement region as for type C, type D, type G and type H of surface emitting laser diodes;

FIG. 33 is a table illustrating evaluation of various types of surface emitting laser diodes;

FIG. 34 is a diagram illustrating relationship between SMP and length of current confinement region in y direction as shape of current confinement region is square, rectangle and circle.

DETAILED DESCRIPTION OF PREFERRED EMBODIMENTS

Figure 1:
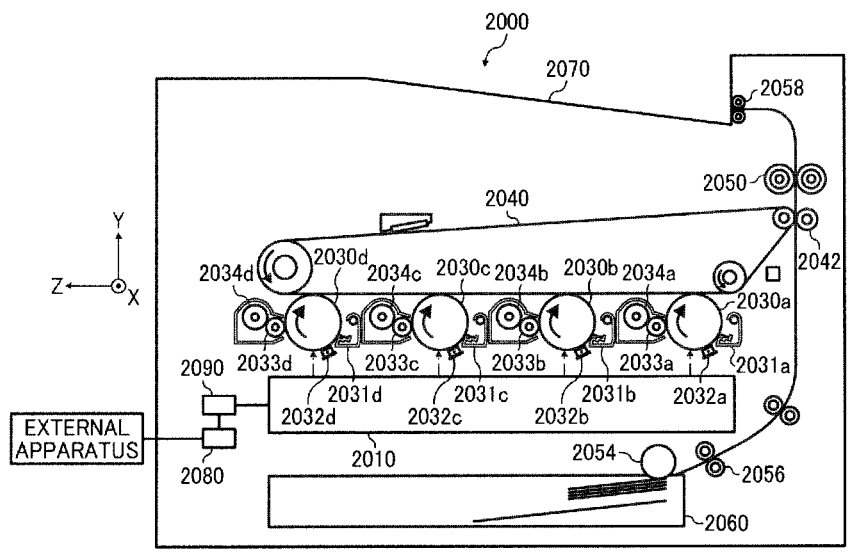
FIG. 1 is a diagram illustrating construction of a color printer, in an exemplary embodiment of this disclosure.
Figure 2:
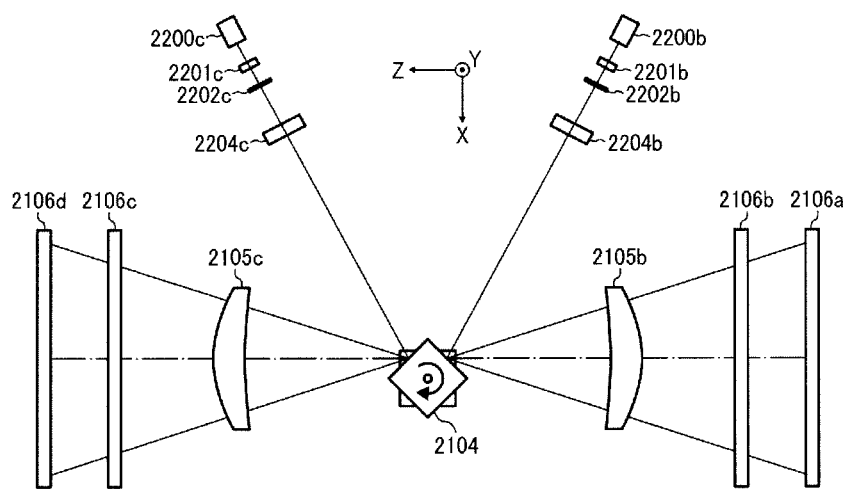
FIG. 2 is a diagram illustrating an optical scanning device provided in the color printer of FIG. 1.
Figure 3:
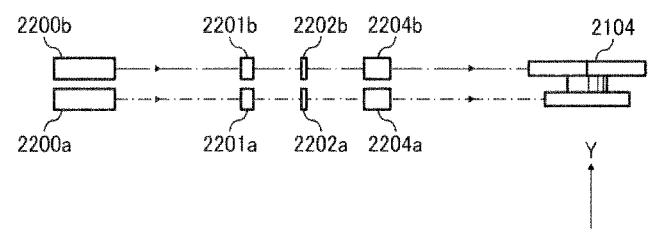
FIG. 3 is a diagram illustrating an optical scanning device provided in the color printer of FIG. 1.
Figure 4:
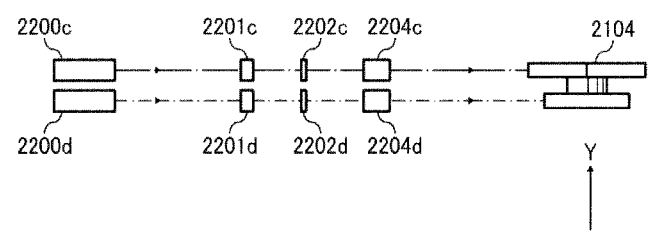
FIG. 4 is a diagram illustrating an optical scanning device provided in the color printer of FIG. 1.
Figure 5:
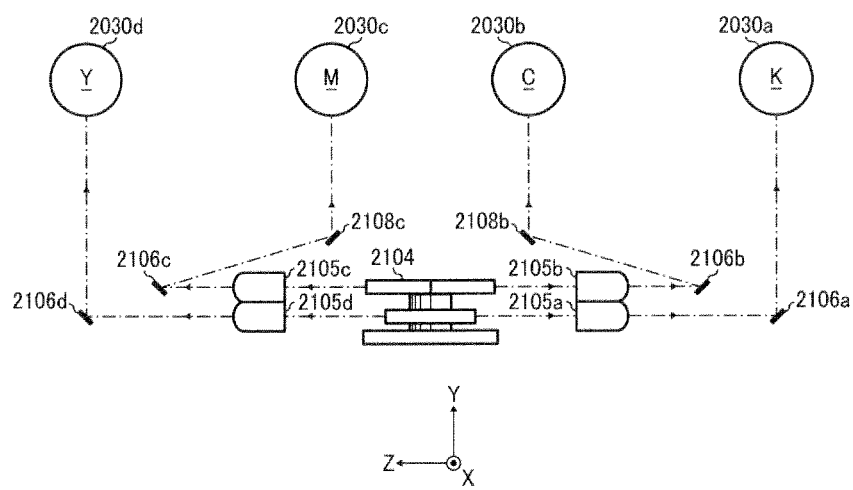
FIG. 5 is a diagram illustrating an optical scanning device provided in the color printer of FIG. 1.

Exemplary embodiments and examples are described in this disclosure with reference to the accompanying drawings. FIG. 1 is a diagram illustrating a configuration of a color printer according to an exemplary embodiment.

The color printer 2000 is an example of an image forming apparatus, in accordance with an exemplary embodiment of this disclosure, and is configured with a tandem system to form color image with four colors (black, cyan, magenta and yellow). It will be appreciated by one skilled in the art that various features and aspects of this disclosure can be applied to an image forming apparatus that is not a color printer per se, but rather is, for example, another device (such as digital copier, facsimile device, multi-function device, etc.) having a color printing or plotting function, a black-and-white printer or another device having a black-and-white printing or plotting function, etc.

The color printer 2000 includes an optical scanning device 2010, four photoreceptor drum (2030a, 2030b, 2030c and 2030d), four cleaning unit (2031a, 2031b, 2031c and 2031d), four electrostatic charger (2032a, 2032b, 2032c and 2032d), four developing roller (2033a, 2033b, 2033c and 2033d), four toner cartridge (2034a, 2034b, 2034c and 2034d), a transfer belt 2040, a transfer roller 2042, a fixing unit 2050, a paper feeding roller 2054, a resist roller pair 2056, a paper ejecting roller 2058, a paper feeding tray 2060, a paper receiving tray 2070, a communication controller 2080 and a printer controller 2090.

Here, in XYZ coordinate system, X direction corresponds to longitudinal direction of the each photoreceptor drum and Z direction corresponds to alignment direction of four photoreceptor drums.

The communication controller 2080 controls bidirectional communication with external apparatuses such as personal computers via the network.

The printer controller 2090 includes a CPU, a ROM saving programs being capable of reading by the CPU and data used in executing the programs, a RAM for working memory, A/D (analog to digital) convertor. The printer controller 2090 outputs color image information (black, cyan, magenta and yellow) to an optical scanning device 2010 via the communication controller 2080. The color image information is provided from other device.

The photoreceptor drum 2030a, the electrostatic charger 2032a, the developing roller 2033a, the toner cartridge 2034a and the cleaning unit 2031a is used as a unit and constitutes K station to form image for black color.

The photoreceptor drum 2030b, the electrostatic charger 2032b, the developing roller 2033b, the toner cartridge 2034b and the cleaning unit 2031b is used as a unit and constitutes C station to form image for cyan color.

The photoreceptor drum 2030c, the electrostatic charger 2032c, the developing roller 2033c, the toner cartridge 2034c and the cleaning unit 2031a is used as a unit and constitutes M station to form image for magenta color.

The photoreceptor drum 2030d, the electrostatic charger 2032d, the developing roller 2033d, the toner cartridge 2034d and the cleaning unit 2031d is used as a unit and constitutes Y station to form image for yellow color.

The photoreceptor drum 2030 is made of a cylindrical member having a photosensitive layer formed on its surface. That is, the surface of the photoreceptor drum 2030 is scanned. The photoreceptor drum 2030 is configured to rotate in a direction indicated by an arrow in FIG. 1.

The electrostatic charger 2032 is configured to uniformly charge the surface of the photoreceptor drum 2030.

The optical scanning device 2010 scans the surface of the photoreceptor drum 2030 electrostatically charged by the electrostatic charger 2032 with luminous flux modulated based on color image information acquired from the external apparatuses to form a latent image corresponding to the acquired image information on the surface of the photoreceptor drum 2030. The latent image formed on the surface of the photoreceptor drum 2030 travels with the rotation of the photoreceptor drum 2030 in a direction toward the developing roller 2033. Note that a configuration of the optical scanning device 2010 is described later.

The developing roller 2033 applies the toner supplied from the toner cartridge 2034 to the latent image formed on the surface of the photoreceptor drum 2030 to make the latent image visible. The latent image applied with the toner (hereinafter also called a "toner image") travels with the rotation of the photoreceptor 2030 in a direction toward the transfer belt 2040.

Each toner image (black, cyan, magenta and yellow) is transferred to the transfer belt 2040 and color image is formed thereon.

The paper feeding tray 2060 contains sheets of recording paper. The paper feeding roller 2054 is arranged near the paper feeding tray 2060 to pick up a sheet of the recording paper from the paper feeding tray 2060 and then transfer the sheet to the resist roller pair 2056. The resist roller pair 2056 temporarily holds the sheet picked up by the paper feeding roller 2054 and transfers it into a gap between the transfer belt 2040 1030 and the transfer roller 2042 with predetermined timing. A color image on the transfer belt 2040 is transferred to the recording paper. The paper bearing the transferred color image is supplied to the fixing unit 2050.

The fixing unit 2050 applies heat and pressure to the recording paper and the toner image is fixed on the recording paper. The recording sheet having the fixed toner image is transferred to a paper receiving tray 2070 via the paper ejecting roller 2058 and sequentially stacked on the paper receiving tray 2070.

The cleaning unit 2031 removes remaining toner from the surface of the photoreceptor drum 2030. The position of the surface of the photoreceptor drum 2030 from which the remaining toner is removed returns to a position that faces the electrostatic charger 2032.

Next, a configuration of the optical scanning device 2010 referenced supra is described.

As illustrated in FIG. 2 to FIG. 5, the optical scanning device 2010 includes four light sources (2220a, 2200b 2200c and 2200d), four coupling lens (2201a, 2201b, 2201c 2201d), four aperture plates (2202a, 2202b 2202c and 2202d), four cylindrical lens (2204a, 2204b, 2204c and 2204d), a deflector 2104, four scanning lens (2105a, 2105b, 2105c and 2105d), six reflecting mirrors (2106a, 2106b, 2106c, 2106d 2108b and 2108c) and a scanning controller (not shown).

Note that a direction corresponding to a main scanning direction is hereinafter called a "corresponding main scanning direction", and a direction corresponding to a sub scanning direction is called a "corresponding sub scanning direction" for convenience.

The light source 2200a, the coupling lens 2201a, the aperture plate 2202a, the cylindrical lens 2204a, the scanning lens 2105a and the reflecting mirror 2106a are optical components provided in the optical scanning device 2010 to form a latent image on the photoreceptor drum 2030a.

The light source 2200b, the coupling lens 2201b, the aperture plate 2202b, the cylindrical lens 2204b, the scanning lens 2105b and the reflecting mirror 2106b are optical components provided in the optical scanning device 2010 to form a latent image on the photoreceptor drum 2030b.

The light source 2200c, the coupling lens 2201c, the aperture plate 2202c, the cylindrical lens 2204c, the scanning lens 2105c and the reflecting mirror 2106c are optical components provided in the optical scanning device 2010 to form a latent image on the photoreceptor drum 2030c.

The light source 2200d, the coupling lens 2201d, the aperture plate 2202d, the cylindrical lens 2204d, the scanning lens 2105d and the reflecting mirror 2106d are optical components provided in the optical scanning device 2010 to form a latent image on the photoreceptor drum 2030d.

The coupling lens (2201a, 2201b, 2201c, 2201d) converts the light flux emitted from the corresponding light source (2200a, 2200b, 2200c, 2200d) into approximately parallel light.

The aperture plate (2202a, 2202b, 2202c, 2202d) having an aperture regulates a beam diameter of the light flux received via the corresponding coupling lens (2201a, 2201b, 2201c, 2201d).

The cylindrical lens (2204a, 2204b, 2204c, 2204d) forms an image near a reflecting surface of the deflector 2104 in the corresponding sub scanning direction (Y axis direction) with the light flux passing through the aperture of the corresponding aperture plate (2202a, 2202b, 2202c, 2202d).

The deflector 2104 has polygon mirror in two stages. Each polygon mirror includes four reflecting surface. The light flux from the cylindrical lens 2204a and the light flux from the cylindrical lens 2204d are deflected on the polygon mirror in a first (down) stage. The light flux from the cylindrical lens 2204b and the light flux from the cylindrical lens 2204c are deflected on the polygon mirror in a second (up) stage. Here, the polygon mirror of the first stage and the polygon mirror of the second stage have phase difference of 45 degree relative to each other. Scanning of these polygon mirrors is performed one after the other.

The light flux from the cylindrical lens 2204a, deflected by the deflector 2104, is irradiated on the photoreceptor drum 2030a after passing the scanning lens 2105a and the reflecting mirror 2106a and a light spot is formed thereon. The light spot moves along a longitudinal direction of the photoreceptor drum 2030a according to rotation of the deflector 2104.

The light flux from the cylindrical lens 2204b, deflected by the deflector 2104, is irradiated on the photoreceptor drum 2030b after passing the scanning lens 2105b and the reflecting mirror (2106c, 2108c) and a light spot is formed thereon. The light spot moves along a longitudinal direction of the photoreceptor drum 2030b according to rotation of the deflector 2104.

The light flux from the cylindrical lens 2204c, deflected by the deflector 2104, is irradiated on the photoreceptor drum 2030c after passing the scanning lens 2105c and the reflecting mirror (2106c, 2108c) and a light spot is formed thereon. The light spot moves along a longitudinal direction of the photoreceptor drum 2030c according to rotation of the deflector 2104.

The light flux from the cylindrical lens 2204d, deflected by the deflector 2104, is irradiated on the photoreceptor drum 2030d after passing the scanning lens 2105d and the reflecting mirror 2106d and a light spot is formed thereon. The light spot moves along a longitudinal direction of the photoreceptor drum 2030d according to rotation of the deflector 2104.

The scanning direction of the light spot is the main scanning direction, and the rotational direction of the photoreceptor drum is the sub scanning direction.

An optical system provided in an optical path between the deflector 2104 and the photoreceptor drum may also be called a scanning optical system.

In FIGS. 6-39, Z axis direction corresponds to laser emission direction, and x axis and y axis are provided in a plane perpendicular to the z axis with mutually perpendicular relationship.

Figure 6:
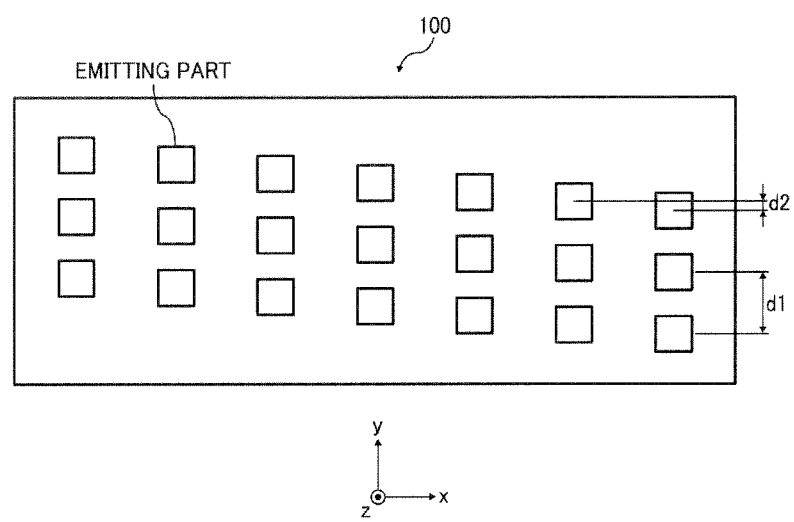
FIG. 6 is a diagram illustrating a surface emitting laser diode array.

The light source (2200a, 2200b, 2200c and 2200d) includes a surface emitting laser diode array 100 which plural surface emitting laser diodes are disposed in two dimensionally in FIG. 6 as an example. It should be appreciated that the array 100, or multiple arrays, can be formed concurrently by the methodologies discussed herein, to form the various layers, one above another, over a wafer or substrate, as discussed herein.

The x axis direction corresponds to the corresponding main scanning direction. The y axis direction corresponds to the corresponding sub scanning direction. The plural surface emitting laser diodes are arranged at equal intervals d2 when all surface emitting laser diodes are orthogonally projected in a virtual line extended in the y axis direction. In this application, the interval means a center to center distance between the two surface emitting laser diodes. The number of the surface emitting laser diodes included therein is not limited to 21.

FIG. 7A is a diagram of an emitting part (surface emitting laser diode) viewing from z axis direction. FIG. 7B is a diagram illustrating a cross section view of A-A in FIG. 7A.

The emitting part is a surface emitting laser of 780 nm wavelength. The emitting part includes a substrate 101, a buffer layer 102, a lower semiconductor DBR (Distributed Bragg Reflector) 103, a lower spacer layer 104, an active layer 105, an upper spacer layer 106, an upper semiconductor DBR 107, an upper electrode 113, a lower electrode 114 and two semiconductor surface structures 116A, 116B.

A surface emitting laser array 100 integrates surface emitting laser diodes.

Figure 8A:
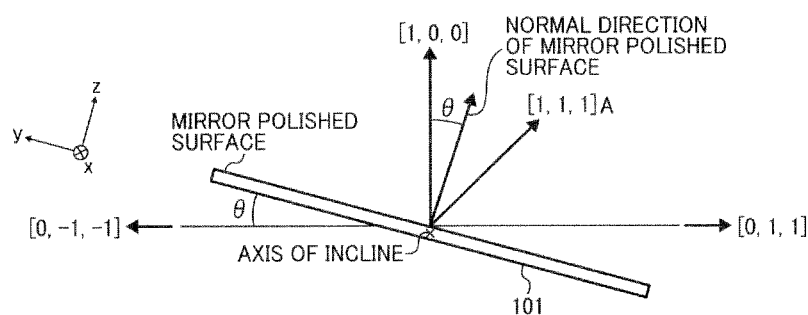
FIGS. 8A and 8B are diagram illustrating a substrate.
Figure 8B:
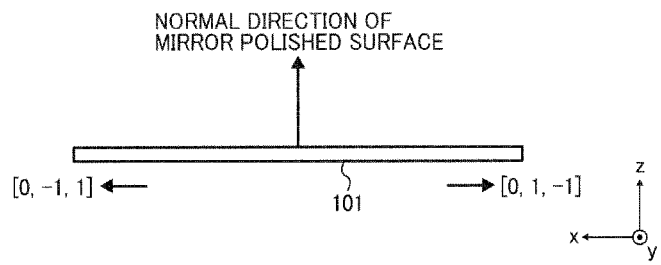

As shown in FIG. 8A, the substrate 101 is an n-GaAs single crystalline substrate having a normal direction of a mirror polished surface inclined by 15 degrees ($\theta=15$) with regard to the [100] crystal orientation in the direction toward the [111]A crystal orientation. Thus, the substrate 101 is an inclined substrate. As shown in FIG. 8B, this specification describes crystal orientation [0−11] is +x direction and crystal orientation [01−1] is −x direction.

As shown in FIG. 7B, the buffer layer 102 is formed on the substrate 101 in +z direction and comprises n-GaAs.

The lower semiconductor DBR 103 is formed on the buffer layer 102 in +z direction and comprises low refractive index layers and high refractive index layers in the form of 40.5 pairs, wherein each pair includes therein a low refractive index layer of n-AlAs and a high refractive index layer of n-$Al_{0.3}Ga_{0.7}As$. Each low refractive index layer and each high refractive index layer have optical thickness of $\lambda/4$ based on oscillation wavelength $\lambda$. If the optical thickness is $\lambda/4$, the actual thickness D of the corresponding layer is $D=\lambda/4n$, where n represents a refractive index of a medium of the layer.

The lower spacer layer 104 is formed on the lower semiconductor DBR 103 in +z direction and is made of un-doped $(Al_{0.1}Ga_{0.9})_{0.5}In_{0.5}P$.

The active layer 105 is formed on the lower spacer layer 104 in +z direction and has GaInAsP/GaInP triple quantum well structure. Each quantum well layer includes a composition of GaInAsP that induces 0.7% compression strain and each barrier layer includes a composition of GaInP that induces 0.6% stretching strain.

The upper spacer layer 106 is formed on the active layer 105 in +z direction. The upper spacer layer 106 is made of un-doped $(Al_{0.1}Ga_{0.9})_{0.5}In_{0.5}P$.

A portion including the lower spacer layer 104, the active layer 105 and the upper spacer layer 106 is called a resonator structure and has an optical thickness of one wavelength. The active layer 105 is provided at the center of the resonator structure located at an anti-node of a standing wave of the electric field so as to obtain a high stimulated emission probability.

The upper semiconductor DBR 107 includes a first upper semiconductor DBR, a second upper semiconductor DBR and a third upper semiconductor DBR.

The first upper semiconductor DBR is formed on the upper spacer layer 106 in +z direction. The first upper semiconductor DBR has a pair of a low refractive index layer made of p-$(Al_{0.7}Ga_{0.3})_{0.5}In_{0.5}P$ and a high refractive index layer made of p-$(Al_{0.1}Ga_{0.9})_{0.5}In_{0.5}P$.

The second upper semiconductor DBR is formed on the first upper semiconductor DBR in +z direction. The second upper semiconductor DBR has 22 pairs of a low refractive index layer made of p-$Al_{0.9}Ga_{0.1}As$ and a high refractive index layer made of p-$Al_{0.3}Ga_{0.7}As$.

The third upper semiconductor DBR is formed on the second upper semiconductor DBR in +z direction. The third upper semiconductor DBR has a pair of a low refractive index layer made of p-$Al_{0.9}Ga_{0.1}As$ and a high refractive index layer made of p-$Ga_{0.5}In_{0.5}As$.

Each low refractive index layer and high refractive index layer have an optical thickness of $\lambda/4$.

A selective oxidation layer made of p-AlAs and having a thickness of 30 nm is inserted in one of the low refractive index layers of the second upper semiconductor DBR. The selective oxidation layer includes, upon oxidation, an oxidized region 108a and a non-oxidized region 108b.

The inserted position of the selective oxidation layer is a third wave node from the active layer 105 in the standing wave of the electric field.

The contact layer 117 is formed on the high refractive index layer p-$Ga_{0.5}In_{0.5}As$ of the third upper semiconductor DBR in +z direction and is made of p-GaAs. A 20 nm thick portion (from the surface on the +z side) of the contact layer 117 is highly doped in Zn, to make ohmic contact with the upper electrode 113.

Next, a method for fabricating the surface emitting laser diode array 100 is described. Note that a product obtained by stacking plural semiconductor layers on the substrate 101 is simply called a stacked product.

(Step S1) The stacked product is formed by crystal growth process conducted by MOCVD (Metal Organic Chemical Vapor Deposition) or MBE (Molecular Beam Epitaxy).

In the crystal growth by MOCVD, trimethylaluminum (TMA), trimethylgallium (TMG), and trimethylindium (TMI) are used as raw materials for group III compound, and phosphine ($PH_3$) and arsine ($AsH_3$) are used as raw materials for group IV compound. Carbontetrabromide ($CBr_4$) and dimethylzinc (DMZn) are used as p-type dopant materials, and hydrogenselenide ($H_2Se$) is used as an n-type dopant material.

(Step S2) A quadrilateral resist pattern is formed on the surface of the stacked product. In this example, the quadrilateral resist pattern has a length of 25.3 µm in an x axis direction, and a length (that is, dimension) of 24.7 µm in a y axis direction.

(Step S3) Next, a mesa structure (hereinafter simply called a "mesa" for convenience) is formed in the form of quadrilateral pillar by an ECR (electron-cyclotron resonance) etching process that uses a $Cl_2$ gas while using the quadrilateral resist pattern as a photo mask. Here, the etching process is controlled such that a bottom surface by the etching is located in the lower spacer layer 104.

(Step S4) The photo mask is removed.

(Step S5) The stacked product is heated under water vapor. Al (Aluminum) of the selective oxidation layer is selectively oxidized from its outer periphery so that the non-oxidized region 108b encircled by the oxidized region ($Al_xAs_yO_z$) 108a remains inside of the mesa as illustrated in FIG. 7B. That is, a current confined structure is formed to restrict a path of drive current for the emitting part to pass through to a central portion of the mesa.

The non-oxidized region 108b can pass the drive current and is called as current confinement region in this application. In this example, the current confinement region 108b has a length of 4.4 µm in an x axis direction, and a length of 4.0 µm in a y axis direction.

(Step S6) A protection layer 111 made of SiN is formed over the entire surface of the stacked product by CVD process (Chemical Vapor Deposition).

(Step S7) Etching mask to form an opening for a contact region and an aperture of the upper electrode 113 is formed on top of the mesa, which is an emission surface of laser beam. The protection layer 111 is etched by BHF (Buffered Hydrofluoric Acid) such that the protection layer 111 has the opening for the contact region and the aperture.

(Step S8) A photo resist is formed in an area other than a high reflectance region, which in the embodiment illustrated in FIG. 7A, is constituted by (i) a circular region including a center of an emission region corresponding to an aperture in the upper electrode above the upper surface of the mesa and (ii) a stripe region including the center of the emission region along the y axis direction.

(Step S9) The contact layer 117 (p-GaAs) without the photo resist in Step S7 is etched by wet etching process till under p-$Ga_{0.5}In_{0.5}As$ layer 107a in the third upper semiconductor DBR is exposed. Mixed liquid of $H_2SO_4$, $H_2O_2$ and $H_2O$ is used as etchant.

(Step S10) The photo resist is removed.

Figure 9:
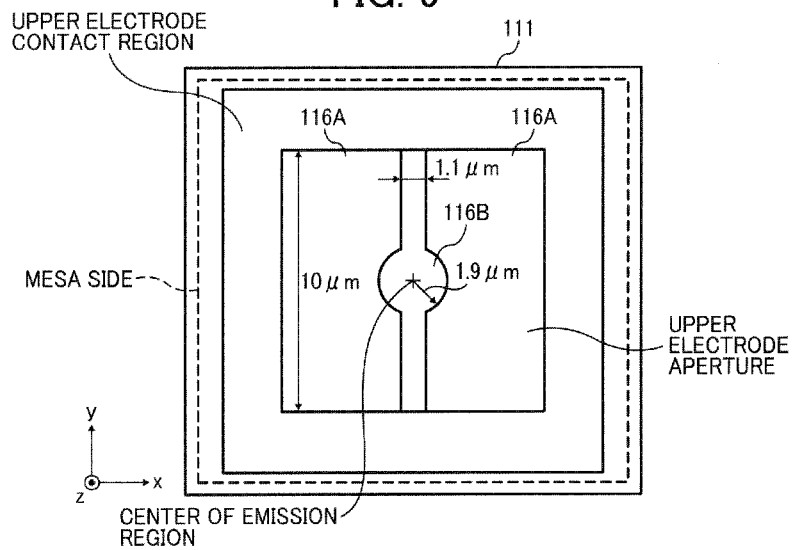
FIG. 9 is a diagram illustrating a first semiconductor surface structure and a second semiconductor surface structure.

Performing the step S9, as shown in FIG. 9, the semiconductor surface structure 116B is formed, which comprises the circular region having 30 µm radius from the center of an emission region (that is, center point of the emission region in the xy plane) and the stripe region including the center of the emission region along y axis direction (which is 1.1 µm wide in the example of FIG. 9). The semiconductor surface structure 116B has relatively higher reflectance.

The semiconductor surface structure 116A is not etched when performing the step S9. The contact layer 117 (p-GaAs) which remains after etching corresponds to the semiconductor surface structure 116A.

The semiconductor surface structure 116A includes two sub regions. The two sub regions sandwich the semiconductor surface structure 116B and face each other corresponding to x axis direction.

In the semiconductor surface structure 116A, reflected light toward the active layer 105 at one interface between the contact layer 117 and the p-$Ga_{0.5}In_{0.5}As$ layer 107a in the third upper semiconductor DBR and at other interface between the contact layer 117 and atmosphere becomes opposite phase of laser beam. The semiconductor surface structure 116A has relatively lower reflectance. In other words, The semiconductor surface structure 116B has higher reflectance than the semiconductor surface structure 116A.

(Step S11) The upper electrode 113 is formed by patterning photo resist, evaporation coating and lift-off. The material of the upper electrode 113 may become a multilayer film of Cr/AuZn/Au or a multilayer film of Ti/Pt/Au. The upper metal line 115 connected with the upper electrode 113 and bonding pad (not described in figure) are formed at the same time, alternatively.

(Step S12) The backside of the substrate 101 is polished in desired thickness (e.g., 100 µm), and the lower electrode 114 is formed on the polished backside surface of the substrate 101 as illustrated in FIG. 7B. In this example, the lower electrode 114 is made of a multilayer film of AuGe/Ni/Au.

(Step S13) The ohmic contact between the upper electrode 113 and the lower electrode 114 is obtained by annealing process. Thus, the mesa structure is formed as the emitting part.

(Step S14) As discussed supra, the array 100 (or multiple arrays 100) is formed concurrently in the methodologies discussed herein, on a wafer or substrate, and a stacked product (or products) is obtained by cutting the wafer or substrate into a chip or multiple chips. After a conventional process is applied for assembly (including, for example, inserting wiring, package, etc.), the surface emitting laser diode array 100 is completed.

By deciding outer shape of the mesa with consideration of anisotropy of oxidation rate according to crystal orientation, an outer shape of the current confinement region 108b can be desirable.

Figure 10A:
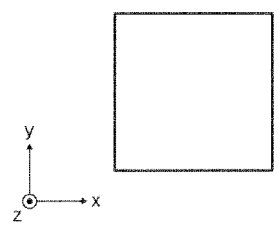
FIGS. 10A, 10B, 10C and 10D are diagram illustrating shape of current confinement region.
Figure 10B:
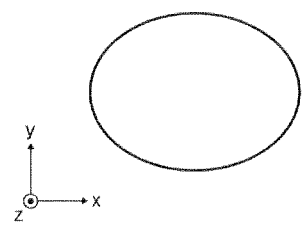
Figure 10C:
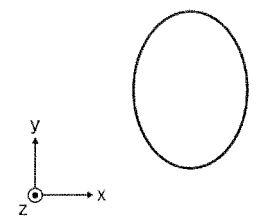
Figure 10D:
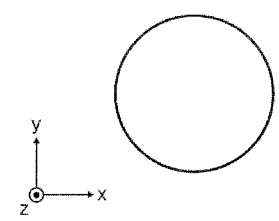

The outer shape of the current confinement region 108b includes variations such as rectangle, square (FIG. 10A), ellipse having a major axis in x axis direction (FIG. 10B), ellipse having a major axis in y axis direction (FIG. 10C) and circle (FIG. 10D).

Hereinafter, the ellipse being longitudinal in (that is, major axis is parallel to) x axis direction is called ellipse A, the ellipse being longitudinal in (that is, major axis is parallel to) y axis direction is called ellipse B.

Hereinafter, "length of the current confinement region in y axis direction/length of the current confinement region in x axis direction" is defined as strain ratio.

Figure 11A:
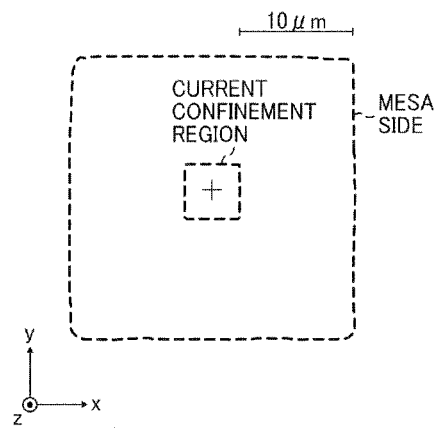
FIGS. 11A and 11B are diagram illustrating relationship between shape of current confinement region and outer shape of mesa structure.

FIG. 11A shows an outer shape of the mesa and the current confinement region having rectangle shape. The area of the current confinement region is about 22 µm$^2$.

Figure 11B:
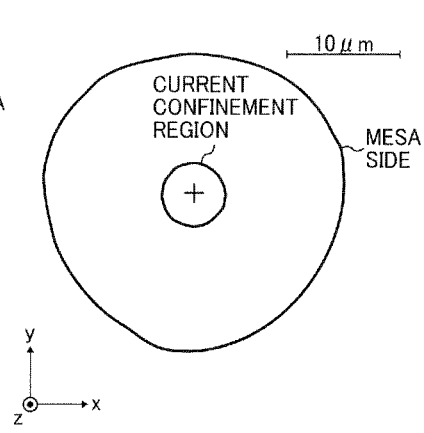

FIG. 11B shows an outer shape of the mesa and the current confinement region having circle shape. The area of the current confinement region is about 22 µm$^2$.

As shown in FIG. 12, plural kinds of surface emitting laser diode array (type A to type H) are manufactured. These diode arrays include same stacked product as described above.

In type A as shown in FIG. 13, outer shape of the current confinement region of the surface emitting laser diode array 100 is rectangle with strain ratio of 0.93.

In type B as shown in FIG. 14, outer shape of the current confinement region of the surface emitting laser diode array 100 is square.

Figure 15:
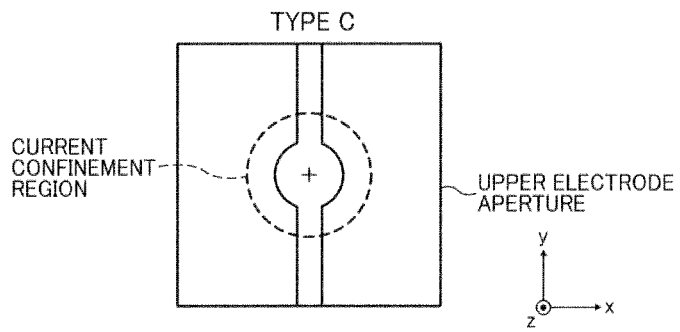
FIG. 15 is a diagram illustrating type C of surface emitting laser diode.

In type C as shown in FIG. 15, outer shape of the current confinement region of the surface emitting laser diode array 100 is circle.

Figure 16:
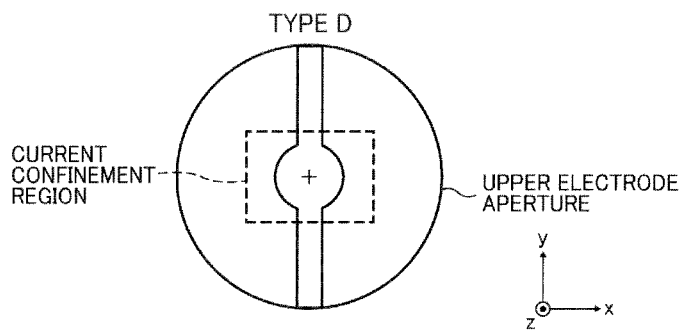
FIG. 16 is a diagram illustrating type D of surface emitting laser diode.

In type D as shown in FIG. 16, outer shape of the current confinement region of the surface emitting laser diode array 100 is rectangle with strain ratio of 0.93 and outer shape of the aperture of the upper electrode 113 is circle.

Figure 17:
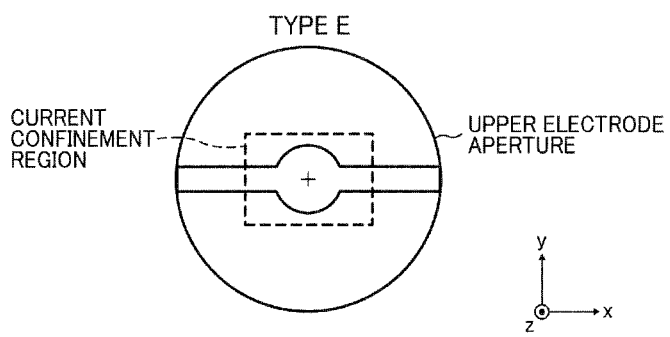
FIG. 17 is a diagram illustrating type E of surface emitting laser diode.

In type E as shown in FIG. 17, outer shape of the current confinement region of the surface emitting laser diode array 100 is rectangle with strain ratio of 0.93, outer shape of the aperture of the upper electrode is circle and the semiconductor surface structure 116A is divided into two sub regions in y axis direction.

Figure 18:
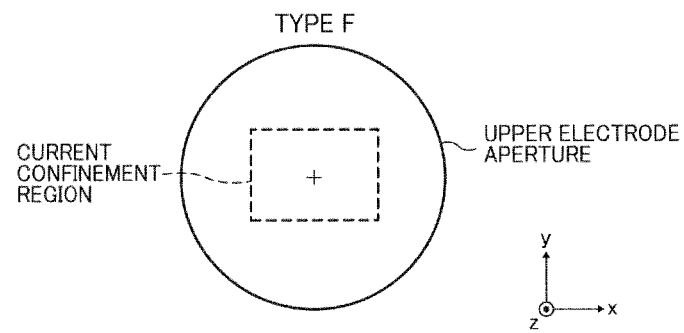
FIG. 18 is a diagram illustrating type F of surface emitting laser diode.

In type F as shown in FIG. 18, outer shape of the current confinement region of the surface emitting laser diode array 100 is rectangle with strain ratio of 0.93, outer shape of the aperture of the upper electrode is circle and the semiconductor surface structure 116A is not provided.

Figure 19:
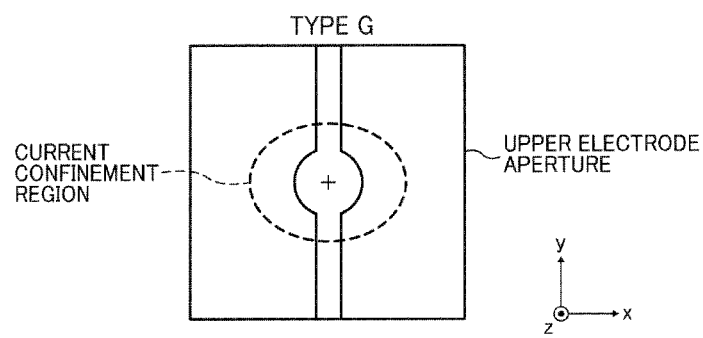
FIG. 19 is a diagram illustrating type G of surface emitting laser diode.

In type G as shown in FIG. 19, outer shape of the current confinement region of the surface emitting laser diode array 100 is ellipse with strain ratio of 0.80 (ellipse A as described).

Figure 20:
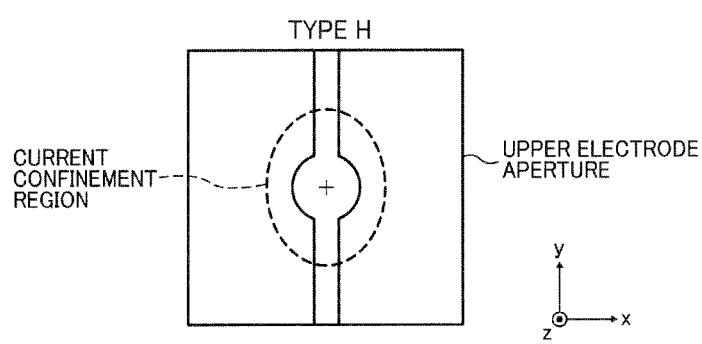
FIG. 20 is a diagram illustrating type H of surface emitting laser diode.

In type H as shown in FIG. 20, outer shape of the current confinement region of the surface emitting laser diode array 100 is ellipse with strain ratio of 1.09 (ellipse B as described).

Figure 21:
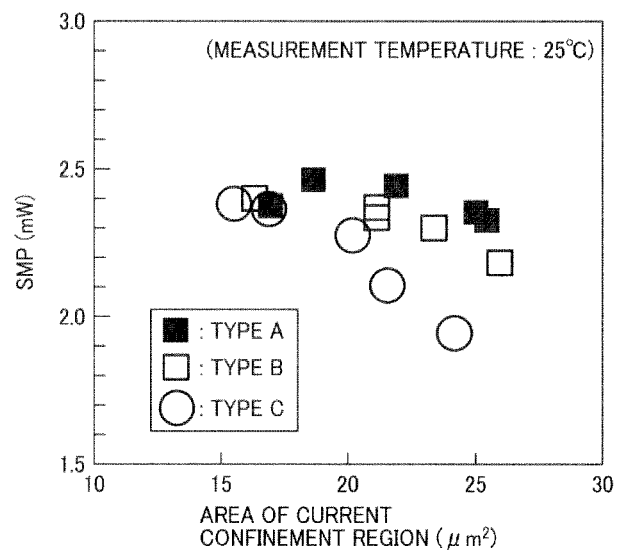
FIG. 21 is a diagram illustrating relationship between SMP and area of current confinement region as for type A, type B and type C of surface emitting laser diodes.

FIG. 21 shows relationship between SMP (Single Mode Power) and area of the current confinement region regarding type A, type B and type C. The value of SMP is decided at an output power when SMSR (Side Mode Suppression Ratio) becomes 20 dB, which SMSR is defined as ratio between output power of single transverse mode and output power of high order transverse mode.

SMP of type A is the highest among type A, type B and type C. Dependency between SMP and area of the current confinement region in type A is the small within this measurement.

SMP of type B is slightly smaller than SMP of type A. When the area of the current confinement region becomes large, the SMP of type B becomes small.

SMP of type C is as high as SMP of type A and type B until about 16 μm². SMP of type C becomes small definitely when area of the current confinement region becomes larger.

Figure 22:
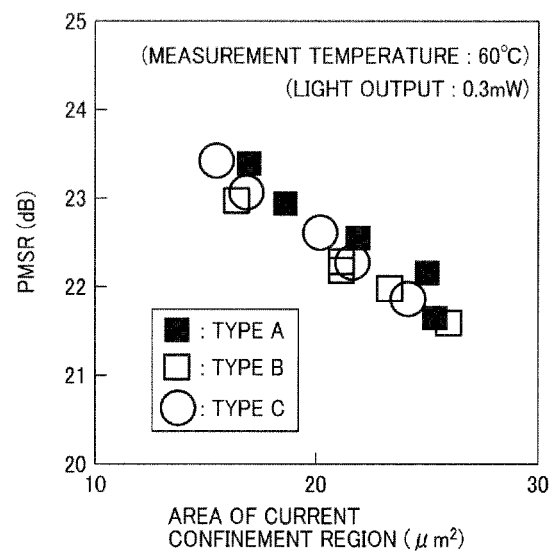
FIG. 22 is a diagram illustrating relationship between PMSR in x axis direction and area of current confinement region as for type A, type B and type C of surface emitting laser diodes.

FIG. 22 shows relationship between PMSR (Polarization Mode Suppression Ratio) in x axis direction and area of the current confinement region regarding type A, type B and type C. The value of PMSR is decided as proportion light output in a determined polarization direction to light output in other polarization direction perpendicular to the determined polarization direction.

Light source for optical scanning apparatus is needed that PMSR is equal to or more than 20 dB. PMSR of type A, type B and type C are sufficient within this measurement although PMSR of type A, type B and type C decrease according to area of current confinement region becomes large.

Figure 23:
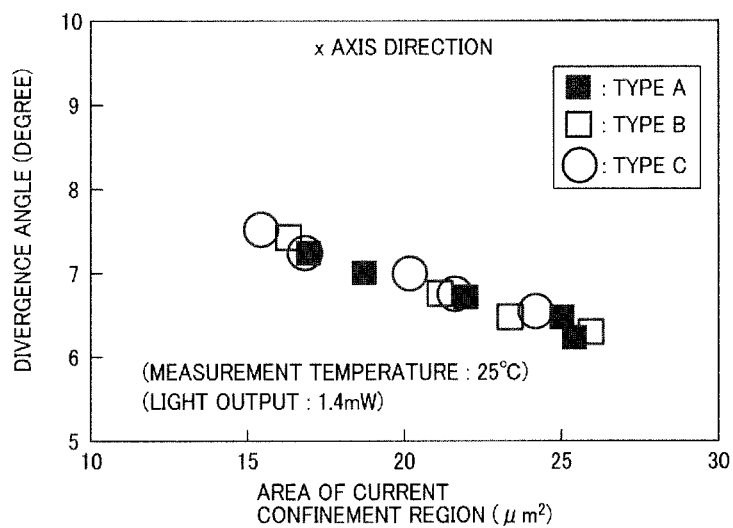
FIG. 23 is a diagram illustrating relationship between divergence angle in x axis direction and area of current confinement region as for type A, type B and type C of surface emitting laser diodes.
Figure 24:
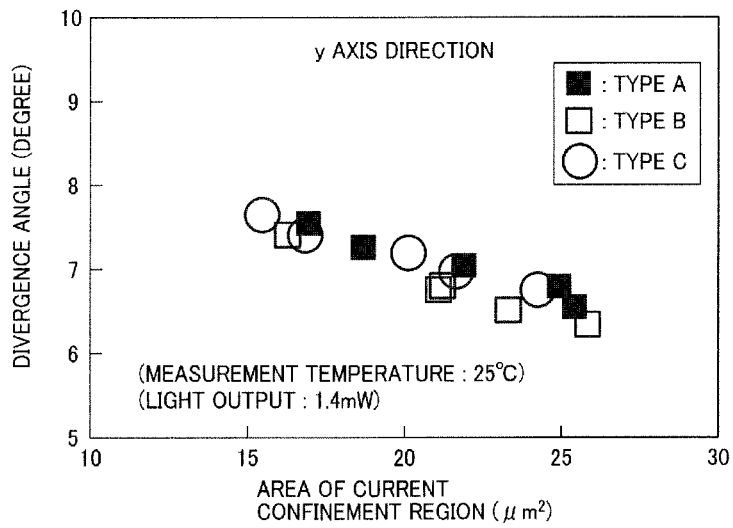
FIG. 24 is a diagram illustrating relationship between divergence angle in y axis direction and area of current confinement region as for type A, type B and type C of surface emitting laser diodes.

FIG. 23 shows relationship between divergence angle in x axis direction and area of the current confinement region regarding type A, type B and type C. FIG. 24 shows relationship between divergence angle in y axis direction and area of the current confinement region regarding type A, type B and type C.

According to from FIG. 21 to FIG. 24, type A and type B may have high SMP value and small divergence angle. The divergence angle in x axis direction of type A and type B are as same as those of in y axis direction. Cross sectional view of output beam of type A and type B become isotropic.

In contrast, type C does not have high SMP value when area of current confinement region becomes large even if type C has high PMSR value and small divergence angle.

High SMP value, high PMSR value and small divergence angle may be realized because outer shape of the current confinement region becomes rectangle and the inclined substrate is provided.

Figure 25:
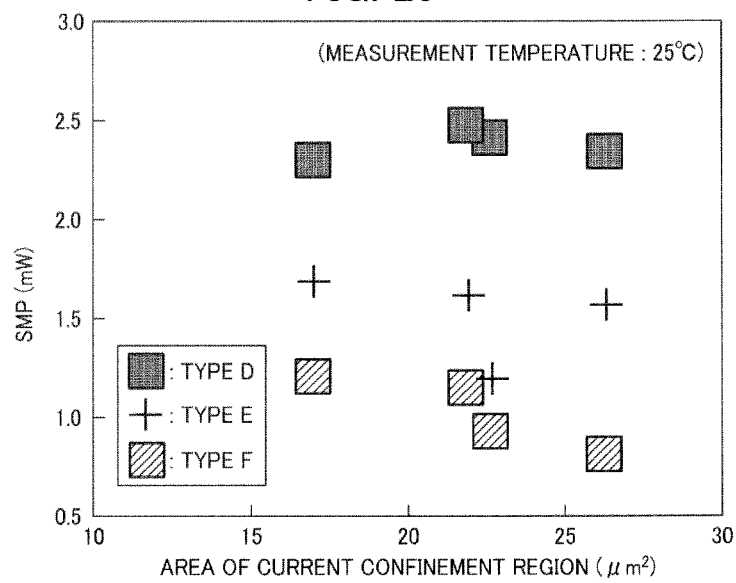
FIG. 25 is a diagram illustrating relationship between SMP and area of current confinement region as for type D, type E and type F of surface emitting laser diodes.

FIG. 25 shows relationship between SMP (Single Mode Power) and area of the current confinement region regarding type D, type E and type F.

SMP of type D is the highest among type D, type E and type F. SMP of type E is smaller than SMP of type D. SMP of type F is smaller than SMP of type E.

Since type E includes the semiconductor surface structure 116A and the semiconductor surface structure 116B and high order transverse mode is restricted, SMP of type E is larger than SMP of type F irrespective of outer shape of the current confinement region.

Figure 26:
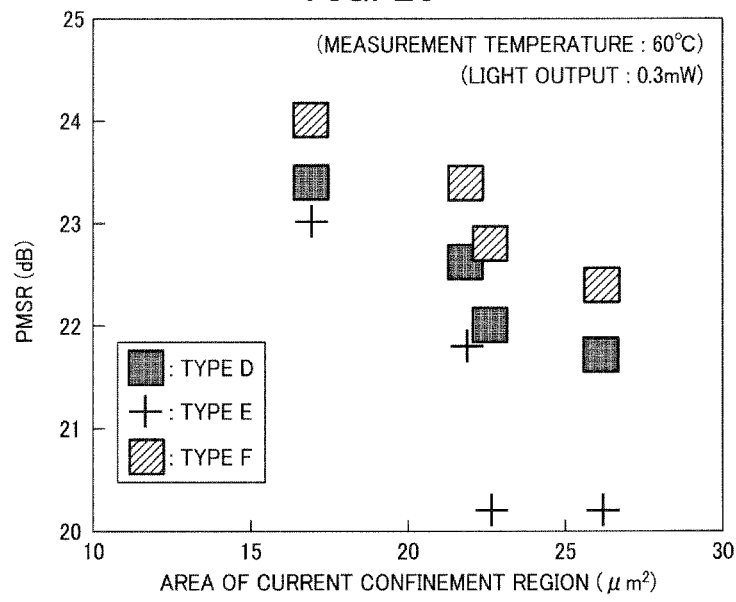
FIG. 26 is a diagram illustrating relationship between PMSR in x axis direction and area of current confinement region as for type D, type E and type F of surface emitting laser diodes.

FIG. 26 shows relationship between PMSR (Polarization Mode Suppression Ratio) in x axis direction and area of the current confinement region regarding type D, type E and type F.

PMSR of type D and type F are sufficient within this measurement (over 20 dB) although PMSR of type D and type F decrease when area of current confinement region becomes large. In contrast, PMSR of type E becomes insufficient within this measurement (over 20 db) when area of current confinement region becomes large.

Therefore, dividing the semiconductor surface structure 116A in x axis direction is superior to dividing the second semiconductor surface structure in y axis direction in view of being stabilized polarization direction.

Since the inclined substrate is provided, PMSR of type F is sufficient although SMR of type F is smaller.

Figure 27:
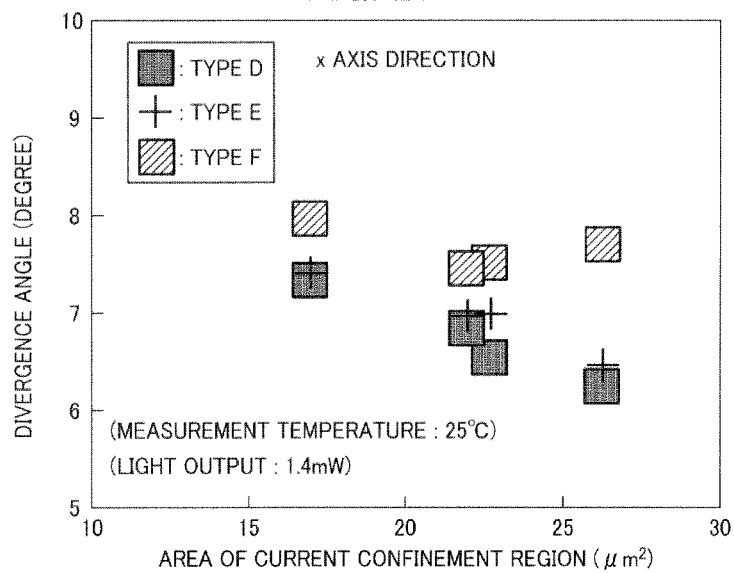
FIG. 27 is a diagram illustrating relationship between divergence angle in x axis direction and area of current confinement region as for type D, type E and type F of surface emitting laser diodes.
Figure 28:
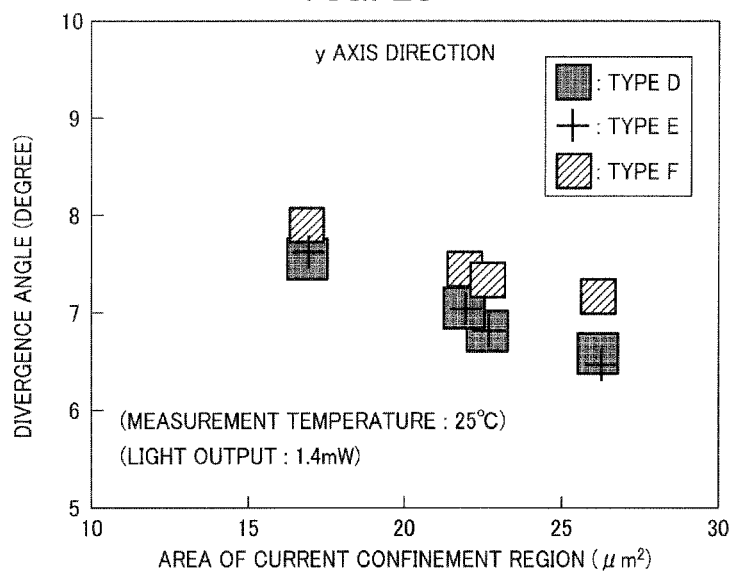
FIG. 28 is a diagram illustrating relationship between divergence angle in y axis direction and area of current confinement region as for type D, type E and type F of surface emitting laser diodes.

FIG. 27 shows relationship between divergence angle in x axis direction and area of the current confinement region regarding type D, type E and type F. FIG. 28 shows relationship between divergence angle in y axis direction and area of the current confinement region regarding type D, type E and type F.

When the semiconductor surface structure 116A is provided and the area of the current confinement region becomes large, the divergence angle becomes small according to FIG. 27 and FIG. 28.

According to FIG. 25 to FIG. 28, type D has high SMP value, sufficient PMSR and small divergence angle.

Type A and type D have almost same trend regarding dependency between area of the current confinement region and SMP, PMSR, divergence angle in x axis direction and divergence angle in y axis direction. Therefore, shape of the aperture of the upper electrode may not be related to aforementioned properties. Accordingly, the discussion infra is not generalized to shape of the aperture of the upper electrode 113.

Figure 29:
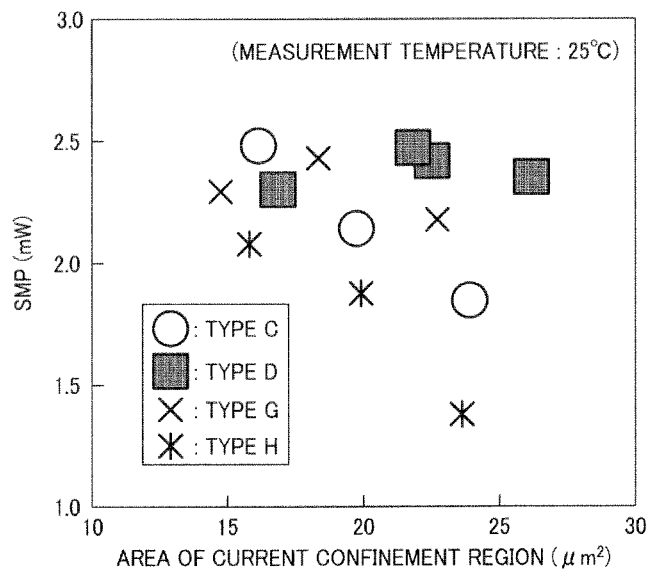
FIG. 29 is a diagram illustrating relationship between SMP and area of current confinement region as for type C, type D, type G and type H of surface emitting laser diodes.

FIG. 29 shows relationship between SMP (Single Mode Power) and area of the current confinement region regarding type C, type D, type G and type H.

Figure 30:
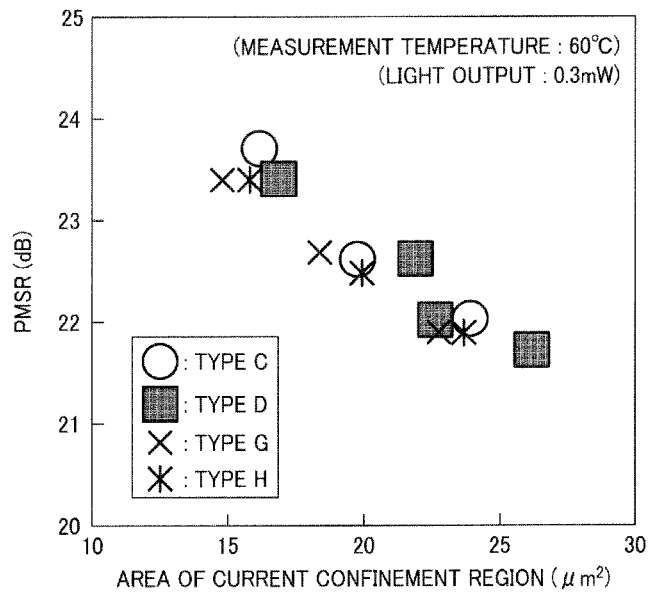
FIG. 30 is a diagram illustrating relationship between PMSR in x axis direction and area of current confinement region as for type C, type D, type G and type H of surface emitting laser diodes.

FIG. 30 shows relationship between PMSR (Polarization Mode Suppression Ratio) in x axis direction and area of the current confinement region regarding type C, type D, type G and type H.

FIG. 31 shows relationship between divergence angle in x axis direction and area of the current confinement region regarding type C, type D, type G and type H.

FIG. 32 shows relationship between divergence angle in y axis direction and area of the current confinement region regarding type C, type D, type G and type H.

Comparing type G with type D, type G has similar value in SMP and divergence angle. PMSR of type G is slightly smaller than that of type D. PMSR of type G is still sufficient. SMP of type H becomes significantly smaller when area of the current confinement region becomes larger, within the range of measurement shown in FIG. 29.

High SMP value, high PMSR value and small divergence angle may be realized, similar to those that may be obtained when the current confinement region has a shape similar to a rectangle, when the outer shape of the current confinement region becomes the ellipse A (longitudinal in x axis direction). When outer shape of the current confinement region becomes the ellipse B (longitudinal in y axis direction), SMP decreases dramatically when area of the current confinement region becomes large.

FIG. 33 shows evaluation of each type, and indicating that type A, type B, type D and type G are good and type C, type E, type F and type H are not satisfactory.

FIG. 34 shows relationship between SMP and length of the current confinement region in y axis direction when outer shape of the current confinement region are square, rectangle and circle referring to results of type A, type B and type C. SMP depends on length of the current confinement region in y axis direction, irrespective of outer shape of the current confinement region, when area of the current confinement region is same. If length of the current confinement region in y axis direction does not become longer than the value which SMP starts decreasing, high SMP value may be realized even though length of the current confinement region in other direction (including x axis direction) becomes large. PMSR value may be also high as same as SMP in same manner.

The reason that length of the current confinement region in y axis direction has the value which SMP starts decreasing is considered as described below. High order transverse mode occurs in plural light spots circumferentially on a circle having center corresponding to the center of emission region. Since the semiconductor surface structure 116A, which has high reflectance, has longitudinal in y axis direction, length of the current confinement region in y axis direction may become large. If length of the current confinement region in y axis direction become longer than the value, SMP starts decreasing.

Each emitting part of the surface emitting laser diode array 100 includes the semiconductor surface structure 116B including center of emission region and having relatively higher reflectance and the semiconductor surface structure 116A having relatively lower reflectance in the emission region when viewing from z axis direction. In the current confinement region 108b, length passing the center of emission region and being parallel to y axis direction (Ly) is equal to or shorter than length passing the center of emission region and being in other direction. And length in another direction (Ls) is larger than Ly. In other words, outer shape of the current confinement region 108b is larger than circle having diameter defined by length passing the center of emission region and being parallel to y axis direction. As for outer shape of the semiconductor surface structure 116B, length passing the center of emission region and being parallel to y axis direction is larger than length passing the center of emission region and being parallel to x axis direction. High single transverse mode, stabilized polarization direction, isotropic beam cross section and small divergence angle may be realized when Ls/Ly is equal to or greater than 1.05. It is desirable if Ls/Ly is equal to or greater than 1.10.

In the related art described above, the outer shape of the current confinement region is circle. On the other hand, such art does not disclose relationship between the semiconductor surface structure and outer shape of the current confinement region.

This disclosure describes a relationship between the semiconductor surface structure and outer shape of the current confinement region. According to the present disclosure, high single transverse mode, stabilized polarization direction, isotropic beam cross section and small divergence angle may be realized in wide range of area of the current confinement region. Therefore, the surface emitting laser diode array 100 may be manufactured in high yield rate.

According to the surface emitting laser diode array 100, optical spots being circle, high light power and small may be realized on photosensitive drum at the same time.

In the surface emitting laser diode array 100, the plural surface emitting laser diodes are arranged at equal intervals d2 when all surface emitting laser diodes are orthogonally projected in a virtual line extended in the y axis direction (corresponding sub scanning direction). Adjusting drive timing of each surface emitting laser diode, it is considered that the plural surface emitting laser diodes are arranged at equal intervals d2 in sub scanning direction.

For example, when d2 is set as 2.65 μm and the optical scanning device 2010 includes an optical system having the magnification of 2, the optical scanning device 2010 scans an image with high density resolution of 4800 dpi. Further, if the number of the emitting part may increase in the main scanning direction, the emitting parts may be arranged in an array configuration that the interval d2 is reduced by narrowing a pitch d1 in the sub scanning direction, and the magnification of the optical system may be reduced, the optical scanning device 2010 may scan an image with even higher density resolution, thereby printing the image with high quality. The writing intervals in the main scanning direction may be easily controlled by adjusting timing of each emitting part.

The color printer 2000 may print the image without lowering printing speeds even though writing dot density is increased. Further, The color printer 2000 may print the image with higher printing speeds when the writing dot density is constant.

Since the polarization direction of the laser beam emitted from each emitting part is stably aligned, the color printer 2000 may stably form the image with high quality.

From FIG. 35A to FIG. 36B show other embodiments regarding the semiconductor surface structure 116B and the semiconductor surface structure 116A.

Figure 35A:
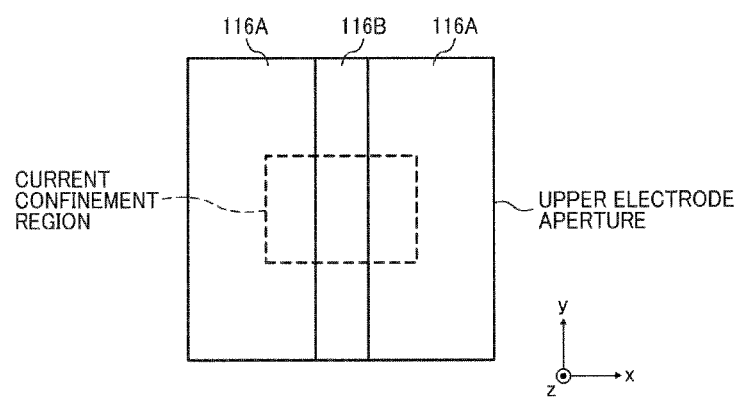
FIGS. 35A, 35B, 36A and 36B are modified diagram illustrating a first semiconductor surface structure and a second semiconductor surface structure.

As shown in FIG. 35A, outer shape of the semiconductor surface structure 116B may be rectangle being longitudinal in y axis direction.

Figure 35B:
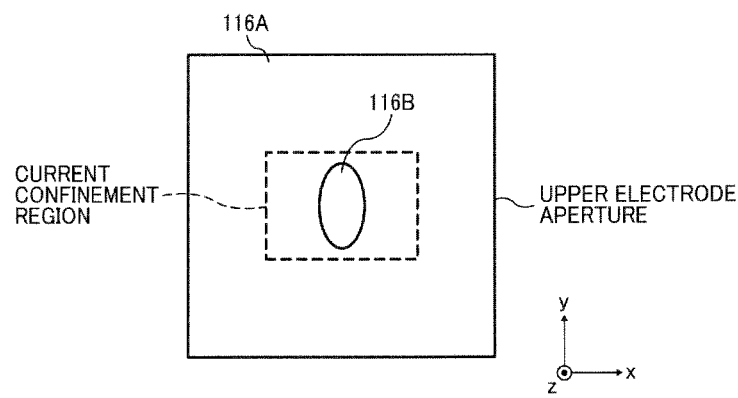

As shown in FIG. 35B, outer shape of the semiconductor surface structure 116B may be ellipse having major axis in y axis direction. The second semiconductor surface structure 116A may surround the first semiconductor surface structure 116B.

Figure 36A:
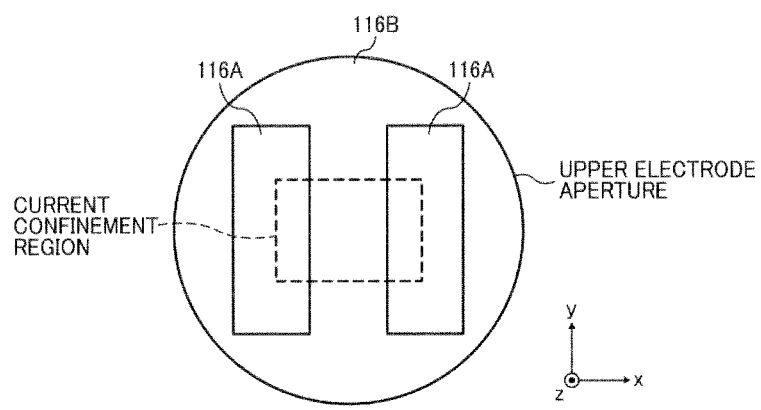

As shown in FIG. 36A, the semiconductor surface structure 116A may be two rectangles being longitudinal in y axis direction and being faced with sandwiched the center of emission region.

Figure 36B:
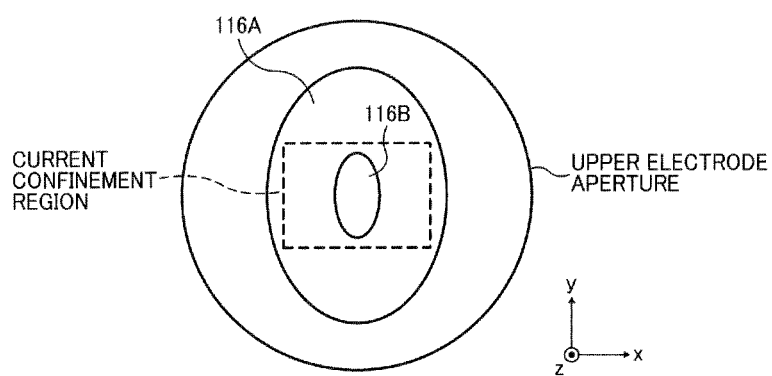

As shown in FIG. 36B, outer shape of the semiconductor surface structure 116B may be ellipse having major axis in y axis direction. The semiconductor surface structure 116A may surround the semiconductor surface structure 116B. The outer shape of the semiconductor surface structure 116A may be ellipse having major axis in y axis direction.

In other embodiments described above, the same effects may be realized as same as the surface emitting laser diode array 100.

Next, plural modified embodiments of surface emitting laser diode array are described. Each modified embodiment of surface emitting laser diode has characteristic being different from structure of the semiconductor surface structure 116B and the semiconductor surface structure 116A. Hereinafter, differences from the surface emitting laser diode array 100 described above are explained. Same part of similar part with the surface emitting laser diode array 100 described above are shown by same note and explanation gets simple or omitted.

First Modified Embodiment

Figure 37:
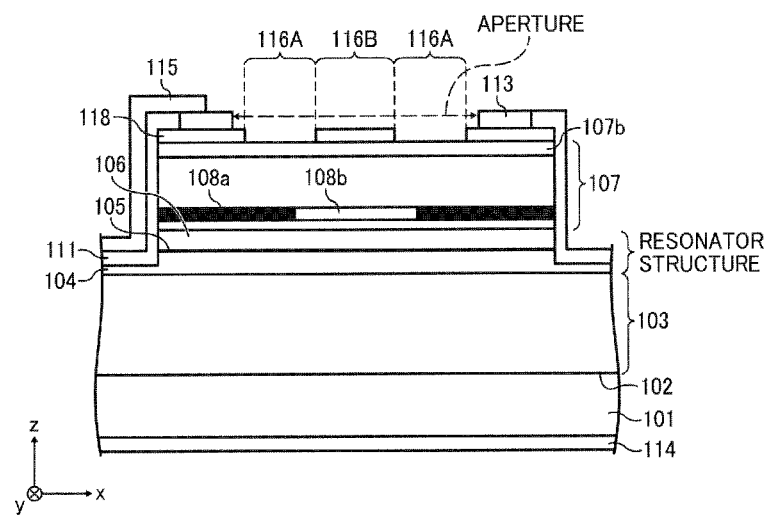
FIGS. 37, 38 and 39 are modified diagram illustrating a surface emitting laser diode array.

FIG. 37 shows first modified embodiment of surface emitting laser diode array. The upper semiconductor DBR 107 includes a low refractive index layer 107b existing in +z axis direction made of p-$Al_{0.9}Ga_{0.1}As$. A semiconductor layer 118 having larger refractive index than the low refractive index layer 107b is formed with an optical thickness of $\lambda/4$ in +z axis direction. Further, the part of semiconductor layer 118 included in the emission region is removed by etching process. The part which the semiconductor layer 118 is removed corresponds to the semiconductor surface structure 116A and the center part which the semiconductor layer 118 is not removed corresponds to the semiconductor surface structure 116B.

In the first modified embodiment, the same effects may be realized as same as the surface emitting laser diode array 100.

Second Modified Embodiment

Figure 38:
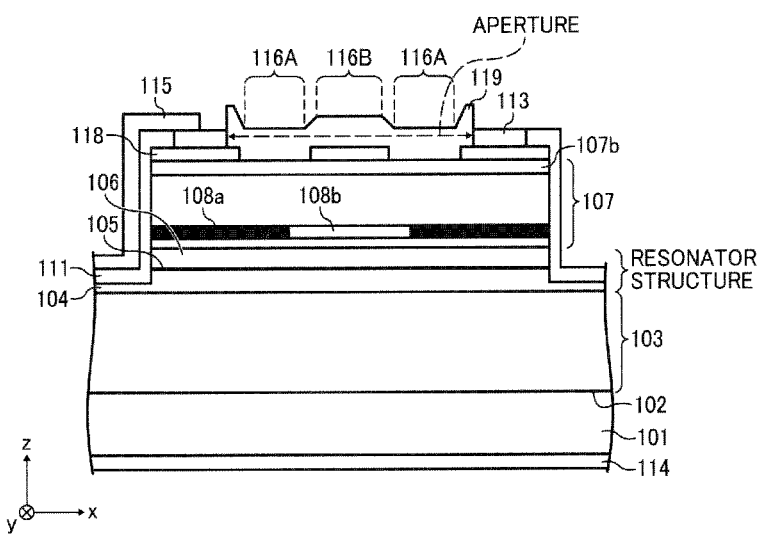

FIG. 38 shows second modified embodiment of surface emitting laser diode array. In this embodiment, the emission region of the surface emitting laser diode array of the first modified embodiment is covered by a dielectric layer 119 having an optical thickness of $2\lambda/4$. For example, the layer 119 occupies the aperture in the upper electrode 113.

In the second modified embodiment, additionally, oxidation and pollution of the emission region may be prevented.

The dielectric layer 118 may be made of any one of SiN, $SiO_2$, SiON, $ZrO_2$, $TiO_2$ and TiN. The dielectric layer 118 may be formed by plasma CVD, electron beam deposition, physical vapor deposition and relative sputtering.

The optical thickness of the dielectric layer 119 becomes even multiple of $\lambda/4$.

Third Modified Embodiment

Figure 39:
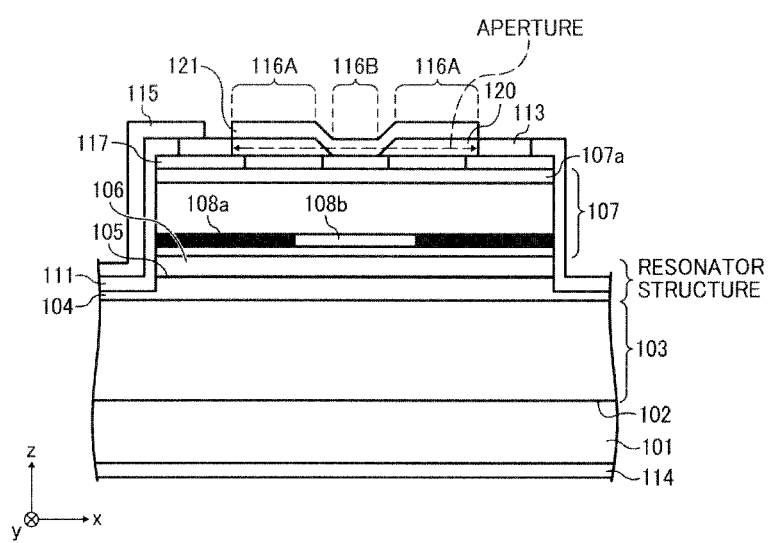

FIG. 39 shows second modified embodiment of surface emitting laser diode array. In this embodiment, the emission region of the surface emitting laser diode array 100 is covered by a low refractive dielectric layer 120 having an optical thickness of $\lambda/4$ and a high refractive dielectric layer 121 having an optical thickness of $\lambda/4$.

In the third modified embodiment, additionally, reliability and durability may be improved.

The optical thickness of each dielectric layer becomes odd multiple of $\lambda/4$. The pair of the dielectric layer 120 and the dielectric layer 121 may be multiple.

According to the surface emitting laser diode array 100 of the present embodiment, each emitting part includes the buffer layer 102, the lower semiconductor DBR 103, the resonator structure including the active layer, the upper semiconductor DBR 107 on the substrate 101. The upper electrode 113 surrounds the emission region which outputs laser beam.

The emission region includes the semiconductor surface structure 116B including center of emission region and having relatively higher reflectance. The emission region includes the semiconductor surface structure 116A having relatively lower reflectance in the emission region when viewing from z axis direction.

As for outer shape of the current confinement region 108b, length passing the center of the current confinement region 108b and being parallel to y axis direction is smaller than length passing the center of the current confinement region 108b and being parallel to x axis direction when viewing from z axis direction. As for outer shape of the semiconductor surface structure 116B, length passing the center of emission region and being parallel to y axis direction is larger than length passing the center of emission region and being parallel to x axis direction when viewing from z axis direction.

Each emitting part outputs laser beam such that high single transverse mode, stabilized polarization direction, isotropic beam cross section and small divergence angle.

The optical scanning device 2010 includes a light source as the surface emitting laser diode array 100. Optical spots being circle, high light power and small may be realized on photosensitive drum at the same time.

The color printer 2000 includes the optical scanning device 2010 and forms high quality images with fast printing speed.

In the above embodiment, the normal direction of the main surface of the substrate 101 is inclined by 15 degrees toward the crystal orientation [111]A direction with regard to the crystal orientation [100] direction. The incline of the normal direction of the main surface of the substrate 101 may not be limited to the above described. The normal direction of the main surface of the substrate 100 may be inclined toward one direction of the crystal orientation [1–1–1]A with regard to one direction of the crystal orientation [100].

It may be described that crystal orientation [0–11] is −x direction and crystal orientation [01–1] is +x direction.

The normal direction of the main surface of the substrate 101 may correspond to crystal orientation [100] and y axis direction may correspond to either one of crystal orientation [011] or crystal orientation [0–11].

In the above embodiment, the oscillation wavelength of each emitting part is 780 nm. However, the oscillation wavelength of the emitting part is not limited to 780 nm. The oscillation wavelength of the emitting part may be changed based on characteristics of the photoreceptor drum.

The surface emitting laser diode array may be used for other apparatuses or devices other than the image forming apparatus. In such cases, the oscillation wavelength may be 650 nm, 850 nm, 980 nm, 1.3 μm, or 1.5 μm based on application purposes. In this case, a III-V semiconductor material is used for the active layer. For example, if the oscillation wavelength is 650 nm, AlGaInP series III-V semiconductor material is used. If the oscillation wavelength is 980 nm, InGaAs series III-V semiconductor material is used. If the oscillation wavelength is 1.3 μm or 1.5 μm, InNAs (Sb) series III-V semiconductor material is used.

The oscillation wavelength is selected based on a material of each reflecting mirror and a configuration of the reflecting mirror. Accordingly, an emission part having a desired oscillation wavelength may be formed. For example, the emission part may be formed of AlGaInP crystal semiconductor material other than AlGaAs crystal semiconductor material. It is preferable that combination of the low refractive index layer and the high refractive index layer may be transparent for the oscillation wavelength and it has the greatest difference in the refractive index between the low refractive index layer and the high refractive index layer.

In the above embodiment, the color printer 2000 is described as the image forming apparatus. The image forming apparatus is not limited to the color printer.

In the above embodiment, the image forming apparatus which the toner image is transferred to the recording sheet is described. The image forming apparatus is not limited to the present embodiment. The image forming apparatus emits light beam directly to a recording medium producing color by the light beam.

As another example, an image forming apparatus may include a silver film as an image carrying member. In this case, a latent image is formed on the silver film by optical scanning, and the latent image is visualized by a process similar to a developing process of an ordinary silver halide photography process. Subsequently, the visualized image is transferred onto photographic printing paper by a printing process similar to that carried out in the ordinary silver halide photography process. The image forming apparatus described above may be implemented as an optical plate-making apparatus or an optical plotting apparatus plotting CT scanned images.

It should be understood that some modifications may be possible within the scope of this disclosure. For example, features from different examples and/or embodiments discussed herein may be combined, or in some instances, one may replace another.

As another example, when the term "perpendicular" is used herein to specify a relationship between two orientations, it should be apparent that the two orientations need not differ by exactly 90°, so long as such difference by approximately 90° may be acceptable, for example, within manufacturing or production tolerance.

What is claimed is:

1. A surface emitting laser diode comprising:
a substrate;
a lower reflector formed over the substrate;
an active layer formed over the lower reflector;
an upper reflector formed over the active layer;
a current restrict structure including a current confinement region surrounded by insulation region, the current restrict structure is disposed in the upper reflector or between the active layer and the upper reflector; and
an upper electrode formed over the upper reflector and including an aperture which corresponds to an emission region from which light is emitted in a first direction perpendicular to a surface of the substrate, the emission region including a higher reflectance region having relatively higher reflectance and including a center of the emission region and a lower reflectance region having relatively lower reflectance; wherein
a first current confinement region length of the current confinement region passing the center of the emission region and parallel to a second direction which is perpendicular to the first direction is equal to or smaller than a second current confinement region length of the current confinement region passing the center of the emission region in any other direction, and a third current confinement region length of the current confinement region in another of the any other direction is larger than the first current confinement region length,
a first higher reflectance region length of the higher reflectance region passing the center of the emission region and parallel to the second direction is larger than a second higher reflectance region length of the higher reflectance region passing the center of the emission region and parallel to a third direction which is perpendicular to both the first direction and the second direction, and wherein
each of (i) the third current confinement region length which is larger than the first current confinement region length parallel to the second direction and (ii) the second higher reflectance region length of the higher reflectance region which is smaller than the first higher reflectance region length parallel to the second direction is parallel to the third direction which is perpendicular to both the first direction and the second direction.

2. The surface emitting laser diode as claimed in claim 1, wherein an outer shape of the current confinement region is ellipse having minor axis in the second direction.

3. The surface emitting laser diode as claimed in claim 1, wherein the lower reflectance region includes two sub regions which sandwiches the higher reflectance region, the two sub regions face each other in the third direction.

4. The surface emitting laser diode as claimed in claim 1, wherein the lower reflectance region surrounds the higher reflectance region.

5. The surface emitting laser diode as claimed in claim 1, wherein the emission region is covered with a dielectric layer.

6. The surface emitting laser diode as claimed in claim 5, wherein an optical thickness of the dielectric layer is even multiple of $\lambda/4$ ($\lambda$: oscillation wavelength).

7. The surface emitting laser diode as claimed in claim 5, wherein the dielectric layer includes at least a pair comprising lower refractive index dielectric film having an optical thickness of odd multiple of $\lambda/4$ and higher refractive index dielectric film having an optical thickness of odd multiple of $\lambda/4$.

8. The surface emitting laser diode as claimed in claim 1, wherein the substrate is inclined such that a normal direction of a main surface of the substrate is inclined from one direction of a crystal orientation [100] toward either one of direction of a crystal orientation [111] or [1–1–1], the third direction corresponds to either one of direction of a crystal orientation [0–11] or [01–1].

9. An optical scanning device optically scanning a scanning surface with light, the optical scanner device comprising:
a light source including the surface emitting laser diode as claimed in claim 1;
a deflector configured to deflect the light emitted from the light source; and
a scanning optical system configured to converge the light deflected by the deflector onto the scanning surface.

10. An image forming apparatus comprising:
at least one image carrying member; and
the optical scanning device as claimed in claim 9 configured to scan light modulated based on image information on the image carrying member.

11. The surface emitting laser diode of claim 1 further comprising
a semiconductor layer interposed between the upper reflector and the upper electrode, wherein a void corresponding to the higher reflectance region and not corresponding to the lower reflectance region is provided in the semiconductor layer.

12. The surface emitting laser diode of claim 1 further comprising a semiconductor layer interposed between the upper reflector and the upper electrode, wherein a void corresponding to the lower reflectance region and not corresponding to the higher reflectance region is provided in the semiconductor layer.

* * * * *